United States Patent [19]

Byron

[11] Patent Number: 5,730,888
[45] Date of Patent: Mar. 24, 1998

[54] BRAGG GRATINGS IN WAVEGUIDES

[75] Inventor: Kevin Christopher Byron, Bishop's Stortford, United Kingdom

[73] Assignee: Northern Telecom Limited, Montreal, Canada

[21] Appl. No.: 647,795

[22] Filed: May 15, 1996

[30] Foreign Application Priority Data

May 17, 1995 [GB] United Kingdom ............... 9509932

[51] Int. Cl.$^6$ .................... G02B 6/10; B44C 1/22
[52] U.S. Cl. ............ 216/24; 216/66; 430/5; 359/569
[58] Field of Search ............ 216/24; 156/654.1; 204/192.34; 359/569

[56] References Cited

U.S. PATENT DOCUMENTS

| | | | |
|---|---|---|---|
| 4,842,633 | 6/1989 | Kuribayashi et al. | 65/44 |
| 5,116,461 | 5/1992 | Lebby | 156/643 |
| 5,327,515 | 7/1994 | Anderson et al. | 385/123 |
| 5,340,637 | 8/1994 | Okai et al. | 428/167 |
| 5,367,588 | 11/1994 | Hill et al. | 385/37 |

FOREIGN PATENT DOCUMENTS 0 271 002   6/1988   European Pat. Off. .

Primary Examiner—R. Bruce Breneman
Assistant Examiner—Michael E. Adjodha
Attorney, Agent, or Firm—Lee, Mann, Smith, McWilliams, Sweeney & Ohlson

[57] ABSTRACT

A phase grating mask is placed in-contact or near contact with an optical waveguide to make a blazed grating in the waveguide. A band of grating elements are defined across a surface of the mask such that in the plane of the surface each element is formed at a predetermined blaze angle to a central longitudinal axis of the band. The grating is made by aligning the waveguide with the axis of the band and irradiating the phase mask. Gratings may be formed in a single step, or in several steps by moving the mask relative to the waveguide after each irradiation. The mask may be formed on a substrate by electron beam lithography.

14 Claims, 2 Drawing Sheets

BRAGG GRATINGS IN WAVEGUIDES

This invention relates to manufacture of optical gratings and in particular to the manufacture of blazed Bragg gratings in optical waveguides.

BACKGROUND OF THE INVENTION

Bragg gratings can be created in photosensitive optical waveguides by illuminating the waveguide with an interference fringe pattern of appropriate pitch, typically generated by ultra-violet light sources.

One technique for generating the interference fringe pattern is to arrange for two coherent radiation beams to intersect each other at an appropriate angle, and to place the waveguide in the resulting interference pattern. An alternative technique uses a first radiation beam to illuminate the length of a waveguide and a second beam to launch radiation along the waveguide. These techniques are shown in U.S. Pat. No. 5,042,897 (Meltz et al.).

The spectral selectivity of a Bragg grating depends in part upon the length of the grating. To accurately manufacture gratings in waveguides by techniques which rely solely on intersecting beams requires wide beams and accurate optical systems.

A different approach to generating interference fringes is to employ a diffraction grating. A photosensitive waveguide is placed close and parallel to the grating while the grating is illuminated by a radiation beam. The constraints on the illuminating beam are lower, and gratings of a significant length can be created in a single writing step. The diffraction grating used in this process is called a phase mask. A fuller explanation of the use of a phase mask is described in an article by K. O. Hill, B. Malo et al. entitled "Bragg gratings fabricated in monomode photosensitive optical fiber by UV exposure through a phase mask", Appl. Physics Letters 62 (10), 8 Mar. 1993. Phase masks for use in the manufacture of the gratings have a pattern of elements, typically a set of parallel grooves etched in a substrate.

A different mask technique is shown in U.S. Pat. No. 5,104,209 (K. O. Hill et al) where a mask having one or more slits is placed over a waveguide and illuminated by a radiation beam. A grating is formed by a 'step-and-repeat' operation along the length of the waveguide. This type of mask is known as an amplitude mask as the mask elements are apertures rather than refractive index steps. The pitch possible with such masks is of the order of several hundred microns, for use in making mode converters, rather than the finer 0.5 micron pitch required for producing Bragg gratings.

Bragg gratings formed in a waveguide usually have their grating elements aligned normal to the waveguide axis. However, there is increasing interest in producing gratings which have their elements at an angle to the waveguide axis, known as blazed Bragg gratings.

The conventional manner of making blazed Bragg gratings is to place a phase mask across the waveguide, the mask being set at the required blaze angle. The problem with using a phase mask in this manner is that there is a limit to the length of gratings which can be made. Longer gratings could be made by a 'step-and-repeat' technique along the waveguide, but at the tolerances involved it is difficult to accurately patch together the separately formed sections.

Longer gratings may also be possible by using a broader phase mask. However, the preferred method of making masks is by etching using an electron beam. This process, while useful, restricts the length of each mask element that can be etched and therefore the angle at which a mask can be placed with respect to a waveguide.

It is an object of the present invention to produce blazed Bragg gratings in a manner which overcomes the problems of the prior art.

SUMMARY OF THE INVENTION

According to an aspect of the present invention there is provided a method of making a blazed Bragg grating in an optical waveguide using an in-contact or near contact phase grating mask having a surface through which, in use, radiation passes, the surface having a band of grating elements defined across it, such that in the plane of the surface each element is formed at a predetermined blaze angle to a central longitudinal axis of the band, the method further comprising aligning the waveguide substantially with the axis of the band and irradiating the phase mask through the surface.

Preferably, a blazed grating of a required length is made in a single step, without requiring relative movement of the grating mask and waveguide. Alternatively, a blazed grating of the required length is made in several steps by relative movement of the mask and waveguide after each step.

According to another aspect of the present invention there is provided a phase grating mask for use in making blazed Bragg gratings in optical waveguides, the mask having a surface through which, in use, radiation passes, the surface having a band of grating elements defined across it, such that in the plane of the surface each element is formed at a predetermined blaze angle to a central longitudinal axis of the band.

By forming a mask which has a band of elements at the required blaze angle, masks etched by an electron beam can be used to create long gratings in waveguides at various blaze angles. Use of such a phase mask allows longer gratings to be created in a single writing step.

The optical waveguide is preferably an optical fibre.

BRIEF DESCRIPTION OF THE DRAWINGS

Embodiments of the invention will now be described with reference to the accompanying drawings in which.

DESCRIPTION OF PREFERRED EMBODIMENTS

Figure 1:
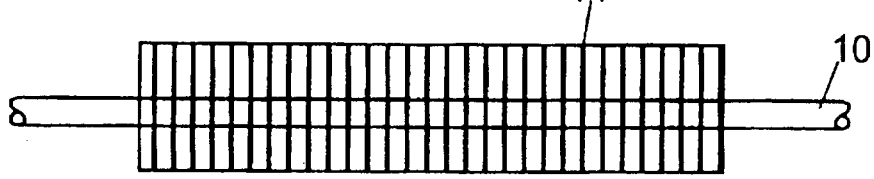
FIG. 1 shows a known method of using a phase mask to manufacture a Bragg grating.

FIG. 1, which is introduced for comparative purposes, shows a conventional phase mask 11 used to manufacture a Bragg grating in optical fibre 10. The grating has elements aligned normally to the axis of the fibre.

Figure 2:
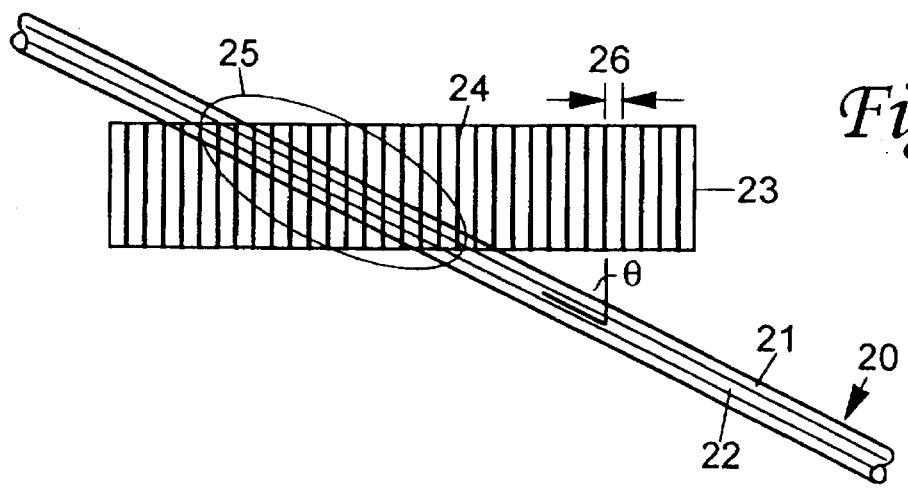
FIG. 2 shows a known method of making blazed Bragg gratings.

FIG. 2 shows a conventional method of using a phase mask, such as that shown in FIG. 1, to make a blazed grating in an optical fibre. Optical fibre 20 comprising core 22 and cladding 21 is overlaid with phase mask 23. The phase mask can be in contact with, or adjacent and parallel to, the fibre.

Phase mask 23 has a series of elements 24 spaced at pitch 26. These elements can be grooves etched into a silica substrate by a process of electron beam lithography.

Phase mask 23 is set such that its elements lie at an angle θ to the longitudinal axis of fibre 20. When irradiated by a source (not shown), a blazed grating is formed over region 25 where the mask overlies photosensitive fibre core 22.

As the blaze angle θ is reduced, the length of grating which can be produced in the fibre core in a single step is shortened.

FIGS. 3 to 6 show improved phase masks used to manufacture blazed Bragg gratings.

Figure 3:
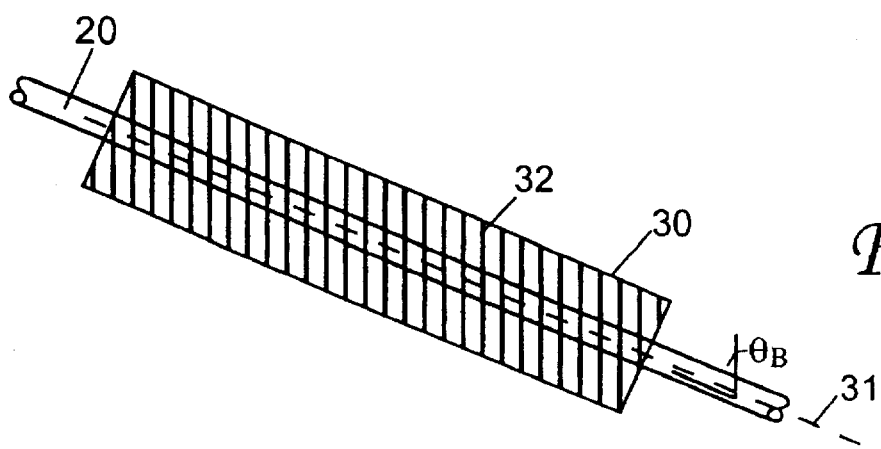
FIG. 3 shows a phase mask used in accordance with one embodiment of the invention.
Figure 4:
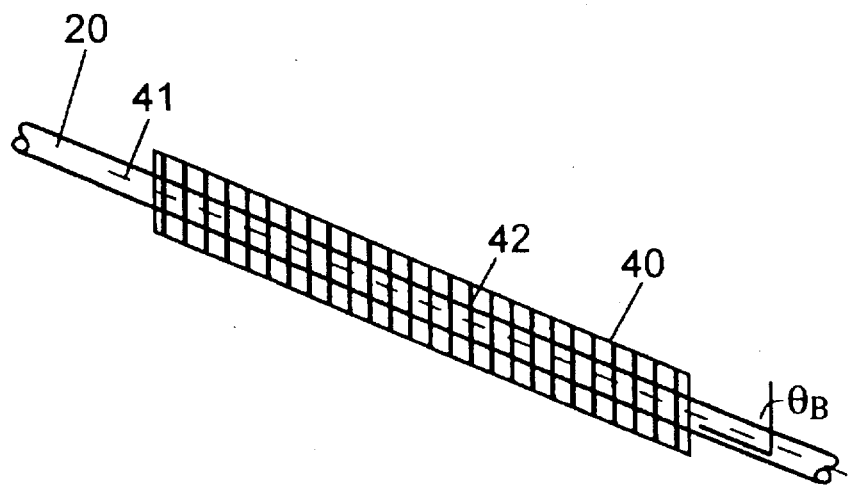
FIG. 4 shows a phase mask which is an alternative to that shown in FIG. 3.

FIGS. 3 and 4 show phase masks 30, 40 having a band of grating elements which occupy the full surface area of the substrate material. Each of the elements 32, 42 are formed across the surface of the mask at a predetermined blaze angle $\theta_B$ to a central longitudinal axis 31, 41 of the band, which axis extends along the surface of the mask. The optical fibre 20 in which the Bragg grating is to be formed is aligned with the central axis 31, 41 of the band of elements. Typically each element is parallel-walled and extends partially into the substrate perpendicularly to the surface of the substrate.

It is possible to create gratings having a blaze angle slightly different to that of the band elements by aligning the fibre at an angle across the mask.

The phase mask is irradiated by a beam expanded spot or scanned by a writing beam to form a grating in the photosensitive core of the optical fibre. By using a phase mask of at least the required length, a grating can be made in a single step without relative movement of the mask and fibre.

Figure 5:
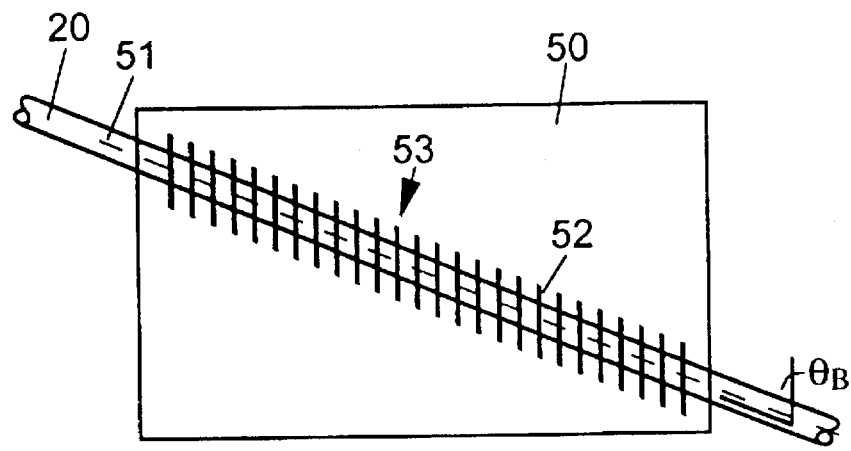
FIG. 5 shows a phase mask used in accordance with another embodiment of the invention.
Figure 6:
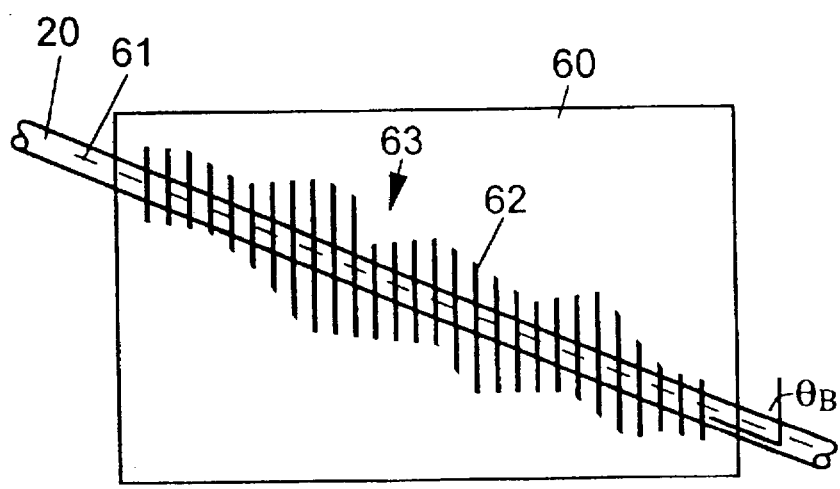
FIG. 6 shows a phase mask which is an alternative to that shown in FIG. 5.

FIG. 5 and 6 show alternative phase masks, of the type which would result from electron beam etching of a substrate. Part of the surface area of a substrate 50, 60 such as silica is etched to form a band 53, 63 of elements 52, 62, each element aligned at a predetermined blaze angle $\theta_B$ to the central longitudinal axis 51, 61 of the band.

As before, the optical fibre 20 in which the grating is to be formed is aligned with the central longitudinal axis of the band of elements, or at some slightly different alignment.

The irregular band of FIG. 6 more closely resembles that which would result in practice by an etching process.

While the improved phase mask allows longer gratings to be made in a single writing step, it is also possible to make longer gratings by a step-and-repeat technique of positioning the phase mask and waveguide, irradiating the mask, moving the mask relative to the waveguide (or alternatively moving the waveguide relative to the mask) and irradiating the mask in this new position. Accurate repositioning is required after each step.

I claim:

1. A method of making a blazed Bragg grating in an optical waveguide using an in-contact or near contact phase grating mask having an irradiating surface through which, in use, radiation passes, the surface having a band of grating elements defined across it, such that each element is formed at a blaze angle to a central longitudinal axis of the band, the blaze angle being defined in the plane of the irradiating surface, the method further comprising aligning the waveguide substantially with the axis of the band and irradiating the phase mask through the irradiating surface.

2. A method of making a blazed Bragg grating as claimed in claim 1 wherein a blazed grating of a required length is made in a single step, without requiring relative movement of the grating mask and waveguide.

3. A method of making a blazed Bragg grating as claimed in claim 1 wherein a blazed grating of a required length is made in several steps by relative movement of the mask and waveguide after each step.

4. A method of making a blazed Bragg grating as claimed in claim 1 wherein the optical waveguide is an optical fibre.

5. A blazed Bragg grating formed in an optical waveguide by a method of making a grating as claimed in claim 1.

6. A blazed Bragg grating as claimed in claim 5 wherein the optical waveguide is an optical fibre.

7. An optical transmission system incorporating a plurality of Bragg gratings as claimed in claim 5.

8. A phase grating mask for use in making blazed Bragg gratings in optical waveguides, the mask having an irradiating surface through which, in use, radiation passes, the surface having a band of grating elements defined across it, such that each element is formed at a blaze angle to a central longitudinal axle of the band, the blaze angle being defined in the plane of the irradiating surface.

9. A phase grating mask as claimed in claim 8 wherein the mask comprises a substrate in which the band of grating elements is formed.

10. A phase grating mask as claimed in claim 9 wherein the substrate is etched by a process of electron beam lithography.

11. A phase grating mask as claimed in claim 10 wherein the band of grating elements partially occupies the surface of the substrate.

12. A phase grating mask as claimed in claim 9 wherein the band of grating elements partially occupies the surface of the substrate.

13. A phase grating mask as claimed in claim 8 wherein the optical waveguide is an optical fibre.

14. A blazed Bragg grating formed in an optical waveguide by using a phase grating mask as claimed in claim 8.

* * * * *